US005756007A

United States Patent [19]

Franey

[11] Patent Number: 5,756,007
[45] Date of Patent: May 26, 1998

[54] COMPOSITION FOR PROTECTION OF DEVICES

[75] Inventor: John Philip Franey, Bridgewater, N.J.

[73] Assignee: Lucent Technologies Inc., Murray Hill, N.J.

[21] Appl. No.: 559,589

[22] Filed: Nov. 16, 1995

[51] Int. Cl.[6] .............. H01B 1/04; H01B 1/24; H01B 1/22; H05F 1/02
[52] U.S. Cl. .............. 252/503; 252/510; 252/511; 428/924; 428/926; 428/925
[58] Field of Search .................. 252/503, 510, 252/511; 427/122, 123; 428/924, 926, 925

[56] References Cited

U.S. PATENT DOCUMENTS

| | | | |
|---|---|---|---|
| 4,496,627 | 1/1985 | Azuma et al. | 428/926 X |
| 4,508,640 | 4/1985 | Kanda et al. | 252/511 X |
| 4,655,966 | 4/1987 | Guillaumon et al. | 252/517 |
| 4,715,989 | 12/1987 | Sullivan et al. | 252/511 X |
| 4,778,636 | 10/1988 | Krieg et al. | 252/511 X |
| 4,818,437 | 4/1989 | Wiley | 252/511 |
| 4,962,139 | 10/1990 | Lo | 252/511 X |
| 5,057,370 | 10/1991 | Krieg et al. | 252/511 X |
| 5,154,886 | 10/1992 | Franey | 422/8 |
| 5,262,229 | 11/1993 | Lampert et al. | 428/220 |
| 5,672,297 | 9/1997 | Soane | 252/511 |

OTHER PUBLICATIONS

CRC Handbook of Chemistry and Physics, 63rd ed., CRC Press, Inc., p. F-110, 1982 * Month not known.

*Primary Examiner*—Douglas J. McGinty
*Attorney, Agent, or Firm*—Richard J. Botos

[57] ABSTRACT

The present invention is a process for protecting articles from electrostatic discharge (ESD) in which a coating is applied directly onto the article in liquid form and the resulting coating provides a surface resistivity that protects the underlying article from ESD. The composition contains a carrier material, carbon black, and a transition metal. The composition forms a coating on an article when applied as a liquid and dried thereon. The ratio of carrier solids to carbon black is about 100 parts by weight polymer to about 0.5 to about 3 parts by weight carbon black. The ratio of carrier solids to transition metal is about 100 parts by weight about 6 to about 15 parts by weight transition metal.

4 Claims, 1 Drawing Sheet

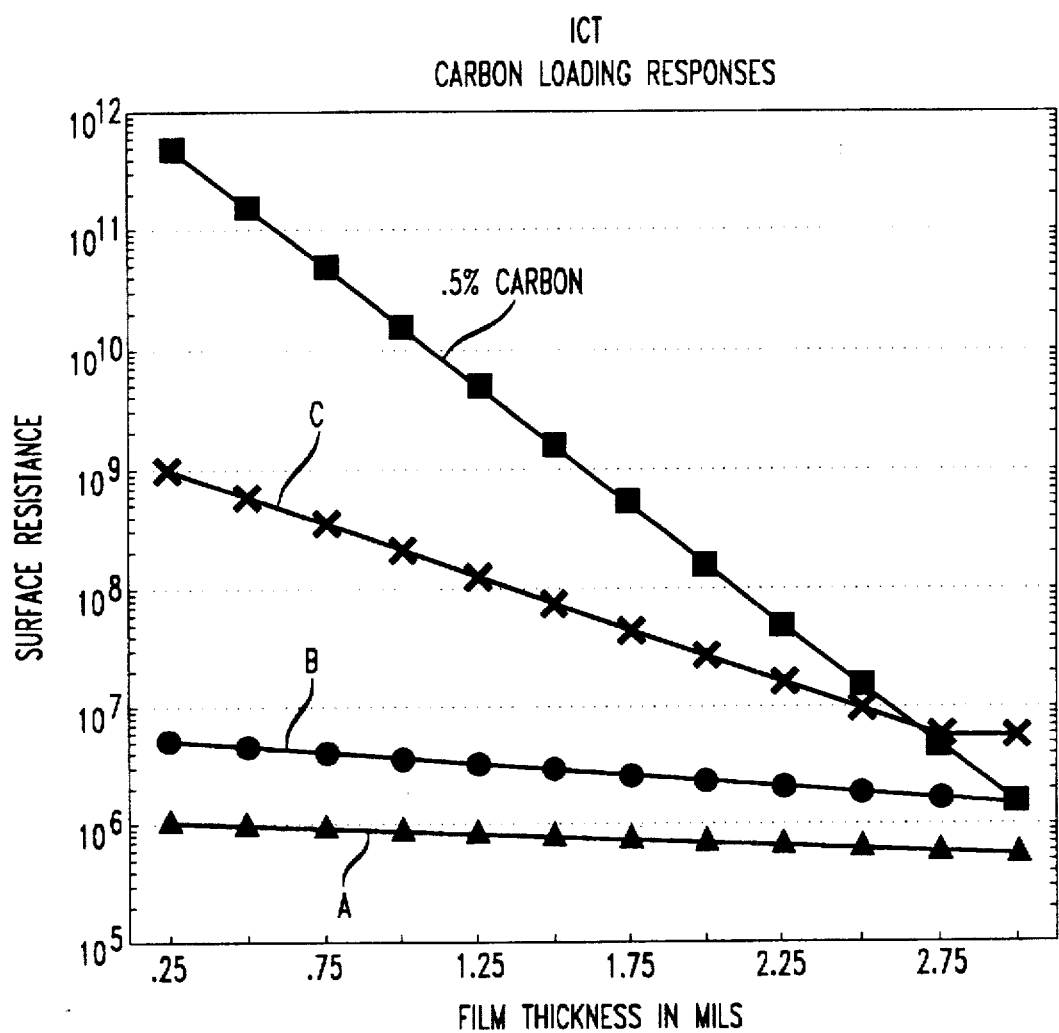

COMPOSITION FOR PROTECTION OF DEVICES

BACKGROUND OF THE INVENTION

1. Field of the Invention

This invention relates to protection of integrated circuits and, in particular, to the corrosion and electrostatic discharge protection of integrated circuits.

2. Art Background

Integrated circuits and their assemblages are typically handled, shipped, and stored in packaging material such as rigid containers, plastic bubble holders sealed with a plastic tape (denominated "tape and reel carriers") plastic bags, and polymer foam. For a wide variety of integrated circuits, electrostatic charge/discharge and possibly corrosion protection must be provided to avoid destruction or serious degradation of the integrated circuit during storage, shipping, or use. For example, static electricity discharge from a person to a device being handled (an occurrence common during the winter season) is often sufficient to produce such damage. Additionally, for devices having exposed metallization that readily corrodes, gases in the air including hydrogen chloride, chlorine and hydrogen sulfide cause degradation, especially when in the presence of water vapor.

Various means have been attempted to provide electrostatic or corrosion protection. In the case of corrosion protection, generally a material containing a volatile organic material is placed in the same shipping container as the integrated circuit. These volatile organic materials such as fatty acids coat the leads of the integrated circuits. The effects of these organic materials on the leads is variable, i.e., at times the organic materials corrode the leads and at other times the organic materials provide some corrosion protection. However, the organic material, because of its volatility, is transient; hence, meaningful protection over a substantial period of time is often lacking. Additionally, the organic material contaminates exposed metal and thus hinders subsequent soldering.

A typical approach for providing electrostatic protection involves the surface metallization of a plastic packing material such as a polyethylene bag with, for example, aluminum. Although this approach yields some electrostatic protection, it is expensive and typically protection is limited because static charge is dissipated too rapidly and the potential for arcing to the device is enhanced. Volatile organic coatings are also employed for electrostatic protection but induce time and humidity dependent variations in surface resistance of the device and have the same shortcomings as result from their use for corrosion protection. Use of an organic polymer in configurations such as polymer bags impregnated with carbon is yet another approach to discharge protection. However, the conductivity of such materials is disadvantageously high for static dissipation purposes, e.g., less than $10^4$ ohms/square, and this conductivity is such a highly nonlinear function of carbon black concentration that a desired conductivity is difficult to achieve reproducibly by conventional manufacturing techniques. Further, the carbon black sheds from the polymer and makes such materials unacceptable for most clean room environments. Thus, the protection of many integrated circuits is less than entirely desirable.

A polymer guard for electrostatic sensitive portions of an integrated circuit device is disclosed in U.S. Pat. No. 5,154,886 to Franey et al. (Franey et al.). The protective coating described in Franey et al. is a polymer matrix impregnated with carbon black particles and a metal that undergoes chemical bonding with the carbon. Although the material described in Franey et al. provides adequate protection, the polymer film is formed into a configuration such as a bag, a rigid container, or a tape. In this example, the minimum thickness of the polymer product is typically 2 mils (0.002 inches), and can be as thick as 500 mils (0.5 inches). In certain instances, it is preferable if the coating is applied directly on the article, rather than placing the article in a container made of the polymer guard. Therefore, a polymer guard that can be applied directly onto the article to be protected is desired.

SUMMARY OF THE INVENTION

The protective coating of the present invention is a mixture that, when applied onto an article and cured, acts as a guard for electrostatic sensitive portions of articles such as an integrated circuit. The coating also yields excellent corrosion inhibition. The carrier is a material that, when applied onto an article in solution form, dries to form a coating on the article. One example of a suitable carrier material is an acrylic copolymer emulsion such as Carboset® CR-780, which is obtained from BFGoodrich Specialty Chemicals of Cleveland, Ohio. Another example is V172641 Extender Varnish which is obtained from ICI Specialty Inks, in Brampton, Ontario. The carrier is combined with particles of carbon black and of a metal that undergoes chemical bonding with the carbon. Carbon black is defined as a finely divided form of carbon such as that obtained by the incomplete combustion of natural gas. For electrostatic protection, exemplary carbon blacks have a high specific surface area (preferably at least 750 $m^2/g$, measured by the $N_2$BET method) and large pore volume (preferably at least 200 ml/100 g). Exemplary of suitable metals are transition metals such as copper, iron, cobalt, manganese, and alloys of these metals.

The composition of the present invention is an emulsion of carrier, solution, carbon black and metal. It is advantageous if the carbon black is about 0.5 weight percent to about 3 weight percent carrier solution. That is, for 100 parts by weight of the carrier solution in the composition, there is about 0.5 to about 3 parts by weight of carbon black. It is advantageous if the metal is about 6 weight percent to about 15 weight percent of the carrier solution. In a preferred embodiment, the metal is copper.

The composition of the present invention is applied onto the article to be protected by conventional expedients for the application of liquid coatings. These expedients include rolling, spraying, and brushing the liquid onto the article. The thickness of the coating is about 0.01 mils to about 1.75 mils. The coating is cured using conventional expedients that depend upon the nature of the specific carrier material used. For example, if the carrier material is a material that polymerizes when exposed to ultraviolet (UV) light, conventional expedients for curing UV materials are used. Coatings of this thickness have a resistivity of about $1\times10^5$ ohms to about $1\times10^9$ ohms.

BRIEF DESCRIPTION OF THE DRAWINGS

The FIGURE is a graph of film thickness vs. surface resistivity.

DETAILED DESCRIPTION

The coating of the present invention is applied directly onto articles to protect the articles from any source of discharge or charge accumulation. This protection is provided by applying the liquid coating onto the article to be protected. The liquid coating contains a carrier material such as the acrylic copolymer emulsion Carboset® CR-780. The particular polymer is not critical however. The carrier is chosen so that the required loading with carbon black and metal does not substantially degrade the resulting film. (Substantial degradation in the context of this invention is loss of mechanical coherency). It is advantageous if the resulting film is transparent or translucent, so that the coated article is visible through the coating.

As previously discussed, the carrier is in the form of an emulsion to which is added a combination of carbon black and metal. The combination is chosen to yield a resulting resistivity of the coating in the range of about $1 \times 10^5$ ohms/square to about $1 \times 10^9$ ohms/square. Resistivities greater than $1 \times 10^9$ ohms/square are not desirable since they do not adequately dissipate electrostatic discharges. The result of high resistivities is a great potential for discharge damage, while resistivities less than $1 \times 10^5$ ohms/square are also not desirable since conduction through the coating to the article is great enough to cause damage if the protected article is an integrated circuit or like device that is susceptible to damage from electrostatic discharge.

Although the exact reason why the composition of the present invention protects articles from electrostatic discharge is not known, an appropriate explanation involves the interaction of the metal with the carbon black and the carrier. A system does not have the appropriate conductivity until the loading material is in sufficient concentration that paths of conducting material are built up. (The term "path" used here does not imply physical contact between adjacent carbon black particles, since it has been established that, for carbon black, conduction by electron tunneling establishes conductivity well before the loading at which physical contact occurs.) In the case of carbon black loading, once these paths are produced, resistivity rapidly decreases with small additions. That is, once paths are established, a number of conducting paths of varying efficiencies connect each surface point with other surface points. Additional carbon black loading produces no significant additional conducting path between surface points. Loading only with metal such as copper yields high resistivity, since the native oxides of these materials are poorly conducting.

The use of both carbon black and an additional material such as a metal presents two possibilities. If the material does not bond to the carbon, as with mica, it will distribute itself randomly in spatial relation to the carbon black conductive paths. The degree to which the conductivity of the carbon black paths are decreased by the higher resistivity material (either a nonconducting material or a semiconducting surface oxide) depends on the amount of material that happens to interrupt the conducting paths. The choice of a material that bonds to the carbon black ensures its presence in the carbon black path and ensures a predictable resistivity increase into the desired resistivity range. In addition, the choice of metals that react with the polymer, such as a transition metal that can undergo one-electron transfer between two states of similar stability, serves to bond both the carbon and the metal to the polymer and essentially eliminate flaking.

The exact resistance obtained using carbon black and a metal is easily controlled by adjusting the amount of metal to carbon black present. That is, the metal with its associated surface oxide chemically bonds to the carbon, the metal is always in the conducting path and a given percentage of metal to graphite will reproducibly yield the same resistivity each time. In contrast, metals that do not bond with the carbon black may or may not be in the conducting path and thus the same composition will not reliably yield the same resistivity.

Generally, for highly conducting carbon blacks (e.g., Black Pearls 2000 which are commercially obtained from Cabot Corp. of Boston, Mass.) loading percentages to the range of 0.1 to about 3 with metal loading percentages in the range of 7 to 25 percent are employed. (Loading percentage is weight percent of additive relative to the polymer weight in the absence of additive. For less conductive carbon black, higher loading of carbon black should be used.) The exact percentages depend on the particular carbon black and metal used. A control sample is easily employed to determine an appropriate composition ratio for a given metal and carbon black material. Various carbon black materials are available. However, highly oxidized, highly porous carbon blacks are advantageous because of their high and reproducible conductivity. Metals that bond to the carbon include copper, cobalt, manganese, iron and their alloys are useful. Iron and copper also provide corrosion resistance to gases such as hydrogen sulfide, chlorine, and hydrogen chloride.

EXAMPLE 1

The following examples illustrate the composition of the present invention.

TABLE 1

| INGREDIENT | WEIGHT (g) | WEIGHT PERCENT |
|---|---|---|
| Carboset ® CR-780 | 100 | 100 |
| Carbon Black | 3 | 3 |
| Copper | 9 | 9 |

The resulting mixture was divided into increments, and each increment was diluted to a different degree. The dilutions were accomplished by adding a certain volume percent of water to the basic composition described above. Although water was used in this example, other materials that can act as a dilvent for the composition described in Table 1 are also contemplated. As illustrated in Table 2 below, each of the resulting mixtures had a different resistivity. The change in resistivity is due to the fact that the coating thickness is inversely proportional to the amount of diluent in the composition and the coating thickness is inversely proportional to the resistivity of the coating.

TABLE 2

| VOLUME PERCENT DILUENT ADDED | RESISTIVITY (ohms/sq) |
|---|---|
| 0 | $10^5$ |
| 20 | $10^6$ |
| 33 | $10^6$ |
| 43 | $10^7$ |
| 47 | $10^8$ |
| 50 | $10^9$ |
| 100 | $10^{12}$ |

Table 2 demonstrates that the amount per unit volume of carbon black in the composition is inversely related to the resistivity of the composition. That is, the lower volume percent carbon black composition has the highest resistivity and the higher weight percent carbon black has the lowest resistivity. Although the applicant does not wish to be held a particular theory, applicant believes that thinner coatings result from the more dilute solutions, and that these thinner coatings provide greater surface resistance due to the lower amount of carbon black on the coating.

EXAMPLE 2

Mixtures of Carboset® CR-780, carbon black and copper were prepared. The composition contained 100 parts by weight percent Carboset® CR-780, and 9 parts by weight percent copper. The mixture was then divided into three equal portions, and carbon black was added to each portion. The amount of carbon black added to each portion was 1, 2 and 3 weight percent. These mixtures are referred to as mixtures A, B, and C, respectively.

The mixtures were then used to form coatings of various thicknesses on polyethylene films which were 3 mils thick. The films were ozone etched on the coated side to enhance the adhesion of the coating onto the substrate. The coatings were formed on the substrates using a low pressure, high volume compressed air spray gun at a pressure of 9 psi. The desired coating thickness was obtained by diluting the coating composition with water, and controlling the speed of a spray pass and the number of coats applied onto the substrate. The resistivity of the coatings were measured using a Kiethly Electronics digital electrometer and an ASTM standard concentric ring adaptor. A summary of the resistivities of the coatings is provided in the table below.

TABLE 3

| Coating Thickness (Mils) | Resistance (ohm/sq) of Coating A | Resistance (ohm/sq) of Coating B | Resistance (ohm/sq) of Coating C |
| --- | --- | --- | --- |
| 0.25 | $1 \times 10^9$ | $5 \times 10^6$ | $1 \times 10^6$ |
| 0.5 | $6 \times 10^8$ | $4.5 \times 10^6$ | $9.5 \times 10^5$ |
| 0.75 | $3.6 \times 10^8$ | $4.05 \times 10^6$ | $9.03 \times 10^5$ |
| 1 | $2.16 \times 10^8$ | $3.65 \times 10^6$ | $8.57 \times 10^5$ |
| 1.25 | $1.3 \times 10^8$ | $3.28 \times 10^6$ | $8.15 \times 10^5$ |
| 1.5 | $7.78 \times 10^7$ | $2.95 \times 10^6$ | $7.74 \times 10^5$ |
| 1.75 | $4.67 \times 10^7$ | $2.66 \times 10^6$ | $7.35 \times 10^5$ |
| 2 | $2.8 \times 10^7$ | $2.39 \times 10^6$ | $6.98 \times 10^5$ |
| 2.25 | $1.68 \times 10^7$ | $2.15 \times 10^6$ | $6.63 \times 10^5$ |
| 2.5 | $1.01 \times 10^7$ | $1.94 \times 10^6$ | $6.3 \times 10^5$ |
| 2.75 | $6.05 \times 10^6$ | $1.74 \times 10^6$ | $5.99 \times 10^5$ |
| 3 | $5.95 \times 10^6$ | $1.57 \times 10^6$ | $5.69 \times 10^5$ |

The above-described formulations provided coatings within the requisite resistivity range when the coating thickness was in the range of 0.25 Mils to about 2.75 Mils. This is in contrast to coatings with a lower content of carbon black, e.g. a composition in which the carbon black content was 0.5 parts by weight per one-hundred parts by weight of carrier material. The relationship between coating thickness and coating resistivity for compositions with 1, 2, 3, and 0.5 weight percent carbon black therein is illustrated in the FIGURE. The FIGURE demonstrates that only very thick coatings of the composition that is 0.5 weight percent carbon black have resistivities in the desired range. However, thinner coatings, (i.e. coatings with a thickness of 1.5 mils or less) have the requisite resistivity if the carbon content of the composition is 1 weight percent or more.

What is claimed is:

1. A composition for protecting articles from electrostatic discharge comprising an emulsion of a carrier material with solids therein, carbon black, and a transition metal that binds to the carbon black in an amount sufficient to protect the article from electrostatic discharge, wherein the composition has a ratio of about 100 parts by weight carrier solids to about 0.5 to about 3 parts by weight carbon black, the ratio of the carrier material to the transition metal is about 100 parts by weight of carrier material to about 6 parts by weight to about 15 parts by weight of the transition metal, and the composition is capable of forming a coating with a thickness of about 0.01 mils to about 1.75 mils and having a resistivity in the range of about $1 \times 10^5$ ohms/square to about $1 \times 10^9$ ohms/square.

2. The composition of claim 1 wherein the composition further comprises a diluent.

3. The composition of claim 1 wherein the transition metal is selected from the group consisting of iron and copper.

4. The composition of claim 3 wherein the carrier material solids are comprised of an acrylic copolymer.

* * * * *